(12) United States Patent
O'Brien et al.

(10) Patent No.: US 10,732,235 B2
(45) Date of Patent: Aug. 4, 2020

(54) MAGNETIC RESONANCE METHOD AND APPARATUS USING ATLAS-BASED MASKING FOR QUANTITATIVE SUSCEPTIBILITY MAPPING

(71) Applicant: Siemens Healthcare GmbH, Erlangen (DE)

(72) Inventors: Kieran O'Brien, Highgate Hill (AU); Markus Barth, St Lucia (AU); Steffen Bollmann, Dutton Park (AU); Benedicte Marechal, Lausanne (CH)

(73) Assignee: Siemens Healthcare GmbH, Erlangen (DE)

( * ) Notice: Subject to any disclaimer, the term of this patent is extended or adjusted under 35 U.S.C. 154(b) by 1 day.

(21) Appl. No.: 15/939,643

(22) Filed: Mar. 29, 2018

(65) Prior Publication Data
US 2019/0302200 A1    Oct. 3, 2019

(51) Int. Cl.
| | | |
|---|---|---|
| *G01V 3/00* | (2006.01) | |
| *G01R 33/24* | (2006.01) | |
| *G01R 33/565* | (2006.01) | |
| *G01R 33/561* | (2006.01) | |

(52) U.S. Cl.
CPC ....... *G01R 33/243* (2013.01); *G01R 33/5616* (2013.01); *G01R 33/56536* (2013.01)

(58) Field of Classification Search
CPC .............. G01R 33/543; G01R 33/5659; G01R 33/3415; G01R 33/36; A61B 5/055
USPC ........................................................ 324/309
See application file for complete search history.

(56) References Cited

U.S. PATENT DOCUMENTS

| | | | | |
|---|---|---|---|---|
| 2009/0313047 A1* | 12/2009 | Smith | ................... | G06Q 50/24 705/3 |
| 2011/0053951 A1* | 3/2011 | Kemp | ................... | A61K 31/505 514/252.05 |
| 2015/0125057 A1* | 5/2015 | Huddleston | ............ | A61B 5/055 382/131 |
| 2015/0145515 A1* | 5/2015 | Liu | ...................... | G01R 33/243 324/309 |

OTHER PUBLICATIONS

Duyn, "MR Susceptibility Imaging," Journal of Magnetic Resonance, vol. 229, pp. 198-207 (2013), Haacke et al., "Quantitative Susceptibility Mapping: Current Status and Future Directions," Magnetic Resonance Imaging, vol. 33, pp. 1-25 (2015).
Haacke et al., "Quantitative Susceptibility Mapping: Current Status and Future Directions," Magnetic Resonance Imaging, vol. 33, pp. 1-25 (2015).

(Continued)

*Primary Examiner* — Walter L Lindsay, Jr.
*Assistant Examiner* — Frederick Wenderoth
(74) *Attorney, Agent, or Firm* — Schiff Hardin LLP

(57) ABSTRACT

In a magnetic resonance method and apparatus, deficiencies in conventional masking in quantitative susceptibility mapping (QSM) are addressed by the inclusion of an additional step in the conventional QSM post-processing pipeline. In this additional step, atlas-based segmentation techniques, which have been developed for morphological applications such as T1w MPRAGE are used in order to provide the mask. This mask is then fed to the remainder of the QSM post-processing pipeline.

18 Claims, 5 Drawing Sheets

(56) References Cited

OTHER PUBLICATIONS

Wang et al., "Quantitative Susceptibility Mapping (QSM): Decoding MRI Data for a Tissue Magnetic Biomarker," Magnetic Resonance in Medicine, vol. 73, pp. 82-101 (2015).
Chatnuntawech et al., "Single-Step Quantitative Susceptibility Mapping with Variational Penalties," NMR in Biomedicine (2016).
Bilgic et al. "Quantitative Susceptibility Mapping with Magnitude Prior" Research Laboaratory of Electronics,, Massachusetts Institute of Technology (2015).
C. Liu: "Susceptibility Tensor Imaging", Magnetic Resonance in Medicine, vol. 63, pp. 1471-1477, 2010.
Langkammer, Christian et al. "Fast quantitative susceptibility mapping using 3D EPI and total generalized variation" NeuroImage; Elsevier, vol. 111; pp. 622-630; 2015 // http://dx.doi.org/10.1016/j.neuroimage.2015.02.041; DOI: 10.1016/j.neuroimage.2015.02.041.
C. Chefd'hotel et al. "Flows of diffeomorphisms for multimodal image registration", INRIA Sophia-Antipolis, France.
A. Janke et al. "Robust methods to create ex vivo minimum deformation atlases for brainmapping", Methods, vol. 73, 2015, pp. 18-26.
T. Liu et al. "Accuracy of the Morphology Enabled Dipole Inversion (MEDI) Algorithm for Quantitative Susceptibility Mapping in MRI", IEEE Transactions on Medical Imaging, vol. 31, No. 3, 2012.
Analysis Group, FMRIB, Oxford, UK: "BET/UserGuide"; https://fsl.fmrib.ox.ac.uk/fsl/fslwiki/BET/UserGuide.
Li W., et.al.: "Quantitative Susceptibility Mapping of Human Brain Reflects Spatial Variation in Tissue Composition", in: Neuroimage., vol. 55, No. 4, pp. 1645-1656; doi: 10.1016/j.neuroimage.2010.11.088.

\* cited by examiner

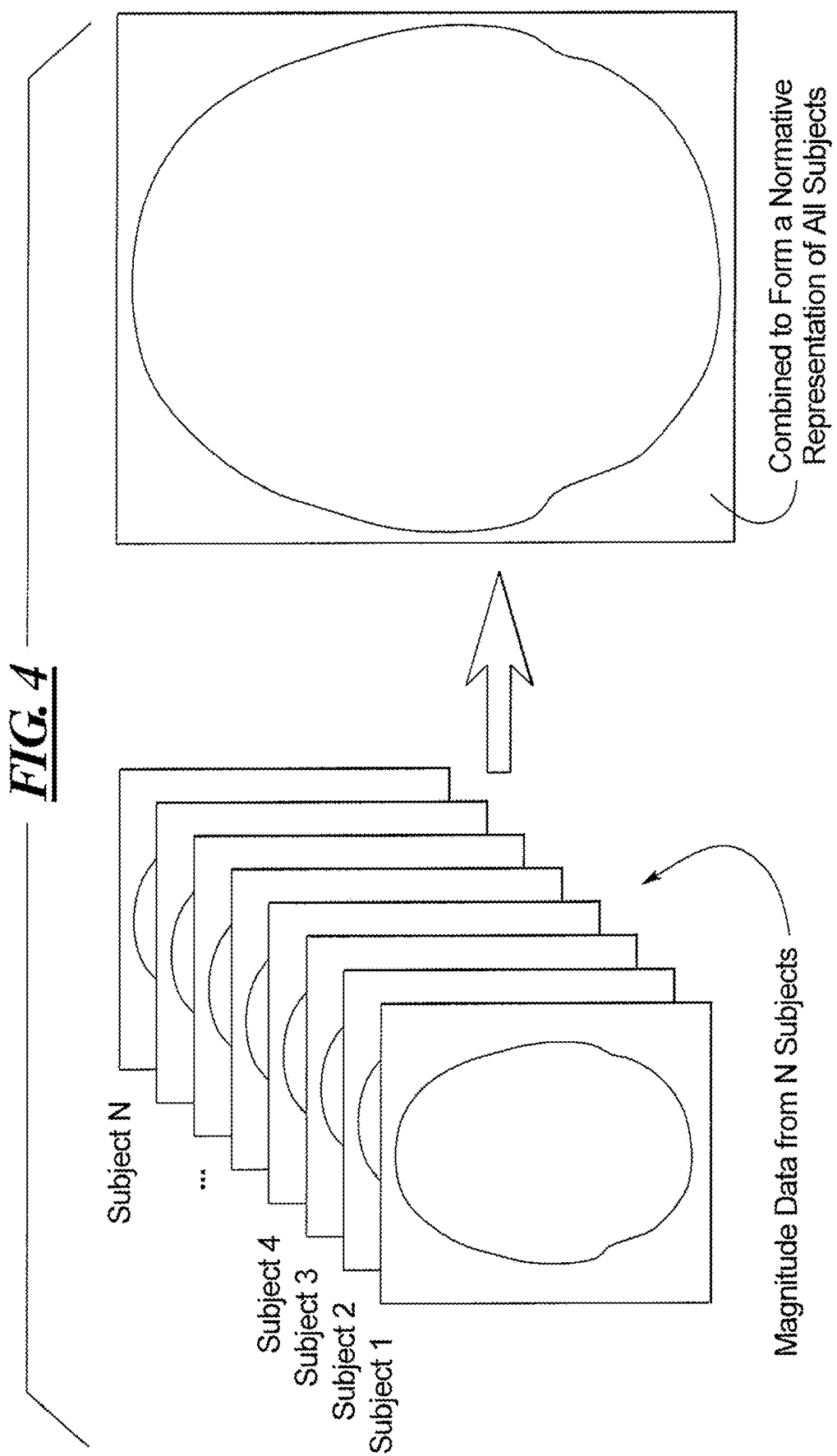

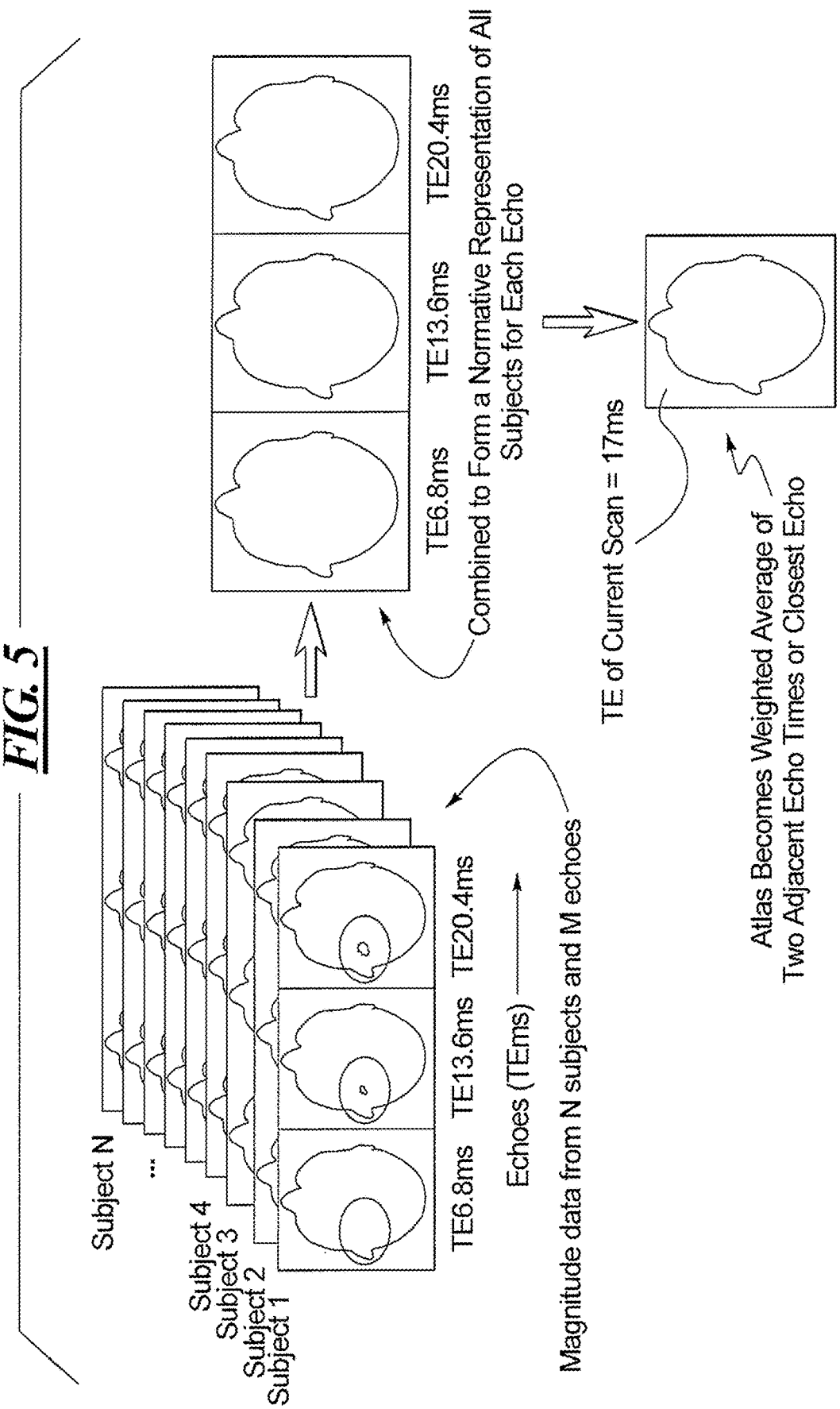

MAGNETIC RESONANCE METHOD AND APPARATUS USING ATLAS-BASED MASKING FOR QUANTITATIVE SUSCEPTIBILITY MAPPING

BACKGROUND OF THE INVENTION

Field of the Invention

The present invention concerns magnetic resonance (MR) imaging, and in particular to the acquisition of the MR data for quantitative susceptibility mapping (QSM).

Description of the Prior Art

Magnetic resonance imaging is a well-known imaging modality in which signals from excited nuclear spins of an examination subject are detected, as those nuclear spins return to a steady state or equilibrium state after being excited. In very general terms, an MR image is produced by the examination subject being situated in a strong and constant basic magnetic field, so that nuclear spins in the examination subject are aligned with the field lines of the basic magnetic field. Certain nuclear spins in the examination subject are given a magnetization, by the radiation of radio-frequency (RF) energy into the examination subject, in the form of RF pulses. The magnetization given to the excited nuclear spins causes those nuclear spins to be deflected from the field lines of the basic magnetic field by an amount known as a flip angle. As these excited nuclear spins relax and return to the steady state, they emit RF signals, detected as MR signals, which are entered as numerical data into a memory as raw data. Each data entry represents a magnitude and phase of the detected MR signal represented by that entry.

The raw data entered into the memory collective represent a type of mathematical notation known as k-space, and therefore the raw data in the memory are referred to as k-space data. By applying a mathematical technique known as Fourier transformation to the k-space data, image data are generated in a procedure or algorithm known as image reconstruction. Usually, the image data are reconstructed primarily from the magnitude information represented in the k-space data. All of these steps or algorithms are performed in a computer or processor, and the image data are then made available from the computer or processor in electronic form, as a data file, which can be archived or provided to a display monitor in order to present a visual representation of the image data, as an MR image of the examination subject.

The aforementioned MR signals that are emitted by the excited nuclear spins are dependent on the induced magnetization that occurs in the tissue composed of the excited nuclei, when placed in a static magnetic field. This measurement of tissue magnetic susceptibility using MR imaging arouse useful information to be obtained with regard to the chemical composition and microstructure of different tissues. Quantitative susceptibility mapping (QSM) is a known post-processing technique wherein the underlying magnetic susceptibility distribution of a tissue sample is computed from the phase information represented in the acquired MR data. This computation takes place in a known manner by solving an inverse problem. Overviews of MR susceptibility imaging and QSM can be obtained by consulting Duyn, "MR Susceptibility Imaging," Journal of Magnetic Resonance, Vol. 229, pp. 198-207 (2013), Haacke et al., "Quantitative Susceptibility Mapping: Current Status and Future Directions," Magnetic Resonance Imaging, Vol. 33, pp. 1-25 (2015), and Wang et al., "Quantitative Susceptibility Mapping (QSM): Decoding MRI Data for a Tissue Magnetic Biomarker," Magnetic Resonance in Medicine, Vol. 73, pp. 82-101 (2015).

The complete QSM pipeline requires sophisticated pre-processing steps that need to be performed prior to calculating the susceptibility map, each of which can influence the result of the accuracy, reliability and reproducibility of the final result. The basic steps in the known QSM pipeline are depicted in FIG. 1.

The QSM pipeline begins with a gradient echo (GRE) based MR data acquisition, wherein the MR data are acquired during a single echo or respectively during multiple echoes. The GRE based MR data acquisition is implemented with phased array coils, each having a coil sensitivity. The coil combination that is used in the GRE based MR data acquisition is then made known to the computer to which the MR data are supplied, which will perform the further steps in order to generate a susceptibility map.

In the next step, masking takes place, which in the case of brain tissue as the tissue of interest is implemented using a known brain mask extraction program. This is followed by phase unwrapping, which again can be implemented using the known PRELUDE program. This is followed by background field removal and dipole inversion, in order to obtain the data that are then used to generate the susceptibility map. The background field removal (background phase removal) can be implemented using the known V-SHARP program.

Further details of the individual steps in this known procedure are described in Chatnuntawech et al., "Single-Step Quantitative Susceptibility Mapping with Variational Penalties," NMR in Biomedicine (2016) and Li et al., "Quantitative Susceptibility Mapping of Human Brain Reflects Spatial Variation in Tissue Composition," NeuroImage, Vol. 55, pp. 1645-1656 (2011).

The step of creating a mask in the QSM pipeline is challenging. As noted above, commercially available programs called brain extraction tools (BET) are available for implementing this step, as are more simple procedures based on thresholding techniques such as Otsu thresholding.

A problem with these known techniques is that the operations are highly dependent on the user's parameter choice, which in turn influences the subsequent steps in the QSM pipeline.

SUMMARY OF THE INVENTION

In accordance with the present invention, the above deficiencies in conventional masking in QSM are addressed by the inclusion of an additional step in the conventional QSM post-processing pipeline. In this additional step, atlas-based segmentation techniques, which have been developed for morphological applications such as T1w MPRAGE are used in order to provide the mask. This mask is then fed to the remainder of the QSM post-processing pipeline.

BRIEF DESCRIPTION OF THE DRAWINGS

FIG. 4 schematically illustrates a first embodiment for forming an atlas from multiple subjects, for use in the masking step in the QSM pipeline in accordance with the present invention.

FIG. 5 schematically illustrates a second embodiment for forming an atlas from multiple subjects, for use in the masking step in the QSM pipeline in accordance with the present invention.

DESCRIPTION OF THE PREFERRED EMBODIMENTS

Figure 2:
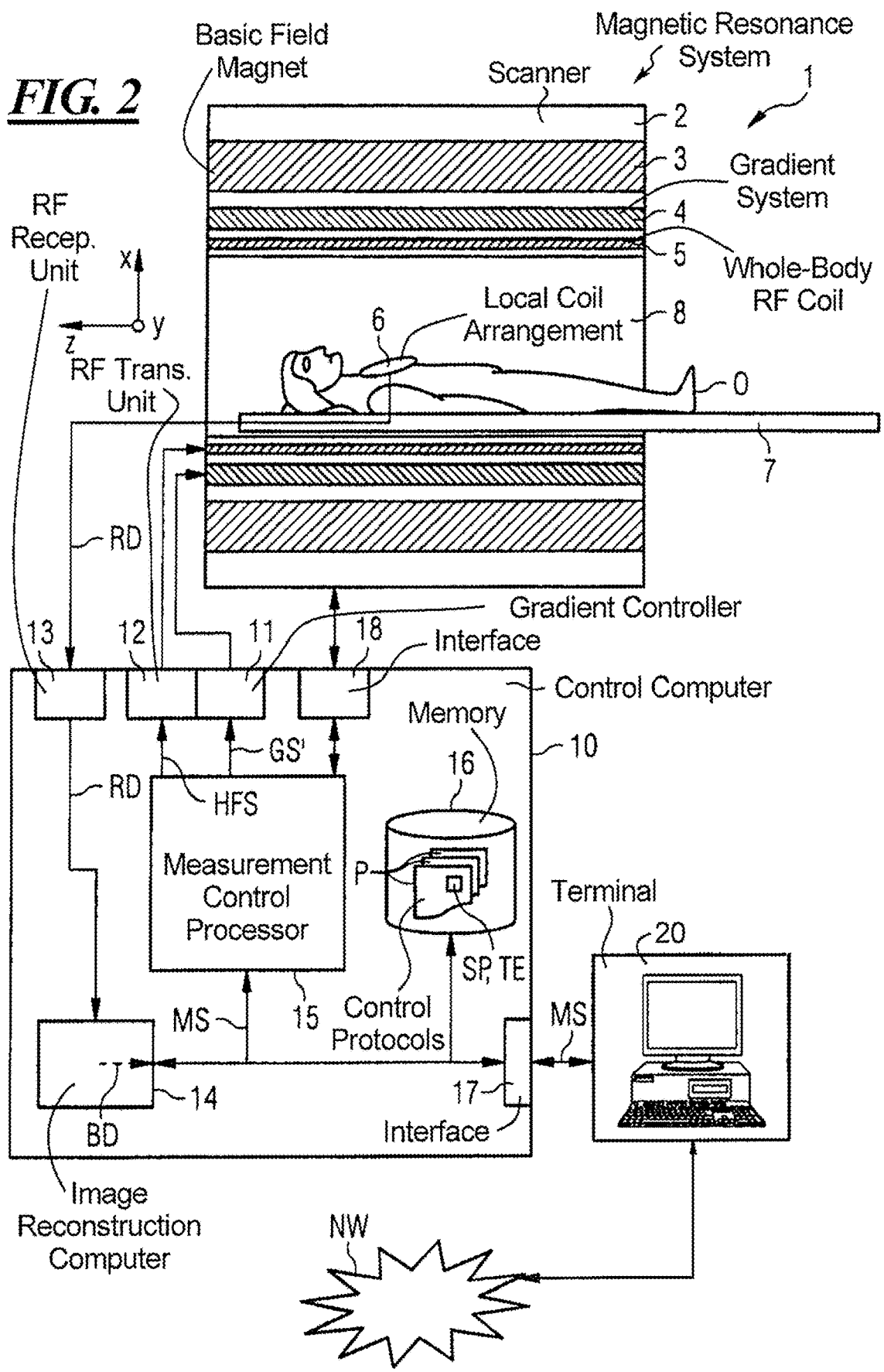
FIG. 2 schematically illustrates a magnetic resonance imaging apparatus constructed and operating in accordance with the present invention.

A magnetic resonance system 1 according to the invention is schematically shown in FIG. 2. It includes the actual magnetic resonance scanner 2 with an examination space or patient tunnel located therein. A bed 7 can be driven into this patient tunnel 8, such that a patient O or examination subject lying on the bed 7 can be supported at a defined position within the magnetic resonance scanner 2 relative to the magnet system and radio-frequency system arranged therein during an examination, or can be moved between different positions during a measurement.

Basic components of the magnetic resonance scanner 2 are a basic field magnet 3, a gradient system 4 with magnetic field gradient coils to generate magnetic field gradients in the x-, y- and z-directions, and a whole-body radio-frequency (RF) antenna 5. The magnetic field gradient coils can be controlled independently of one another in the x-, y- and z-directions so that gradients can be applied in arbitrary logical spatial directions (for example in the slice-selection direction, in the phase coding direction or in the readout direction) via a predetermined combination, wherein these directions normally depend on the selected slice orientation. The transmission (radiation) of RF signals in order to induce of magnetic resonance signals in the examination subject O can take place via the whole-body antenna 5. The MR signals are received with a local coil 6, which can be composed of one or more individual reception coils. The local coil 6 can also be used to radiate the RF signals. All of these components are known in principle to those skilled in the art and therefore are only schematically shown in FIG. 1.

The components of the magnetic resonance scanner 2 are controlled by a control computer, which can be formed by a number of individual computers (which may be spatially separated and connected among one another via suitable cables or the like). This control computer 10 is connected via a terminal interface 17 with a terminal 20 via which an operator can control the entire system 1. In the present case, this terminal 20 (as a computer) is equipped with keyboard, one or more monitors and additional input devices (for example mouse or the like) so that a graphical user interface is provided to the operator.

Among other things, the control computer 10 has a gradient controller 11 that can in turn have multiple subcomponents. Via this gradient controller 11, the individual gradient coils are provided with control signals according to a gradient pulse sequence GS. These gradient pulses are radiated (activated) at precisely provided time positions and with a precisely predetermined time curve during a measurement.

The control computer 10 also has a radio-frequency transmission unit 12 in order to feed electrical signals respectively representing radio-frequency pulses into the whole-body radio-frequency coil 5 (or the local coil 6) according to a predetermined radio-frequency pulse sequence RFS of the pulse sequence MS. The radio-frequency pulse sequence RFS includes excitation and/or refocusing pulses. The reception of the magnetic resonance signals then occurs with the use of the reception coils of the local coil 6, and the raw data RF received in this manner are read out and processed by an RF reception unit 13. The magnetic resonance signals are passed in digital form as raw data RF to a reconstruction computer 14, which reconstructs the image data BD from the raw data using the reconstruction algorithm described above, and stores the image data BD in a memory 16 and/or passes the image data BD via the interface 17 to the terminal 20 so that the operator can view the image. The image data BD can also be stored at other locations via a network NW and/or be displayed and evaluated.

Control commands are transmitted via an interface 18 to other components of the magnetic resonance scanner 2 (such as the bed 7 or the basic field magnet 3, for example), and measurement values or other information are received.

The gradient controller 11, the RF transmission unit 12 and the RF reception unit 13 are controlled, in a coordinated manner, by a measurement control processor 15. Via corresponding commands, this ensures that the desired gradient pulse sequences GS and radio-frequency pulse sequences RFS are emitted. Moreover, for this purpose it must be ensured that the magnetic resonance signals are read out by the reception coils of the local coil array 6 by the RF reception unit 13 at the appropriate point in time and are processed further. The measurement control processor 15 likewise controls the interface 18.

Figure 3:
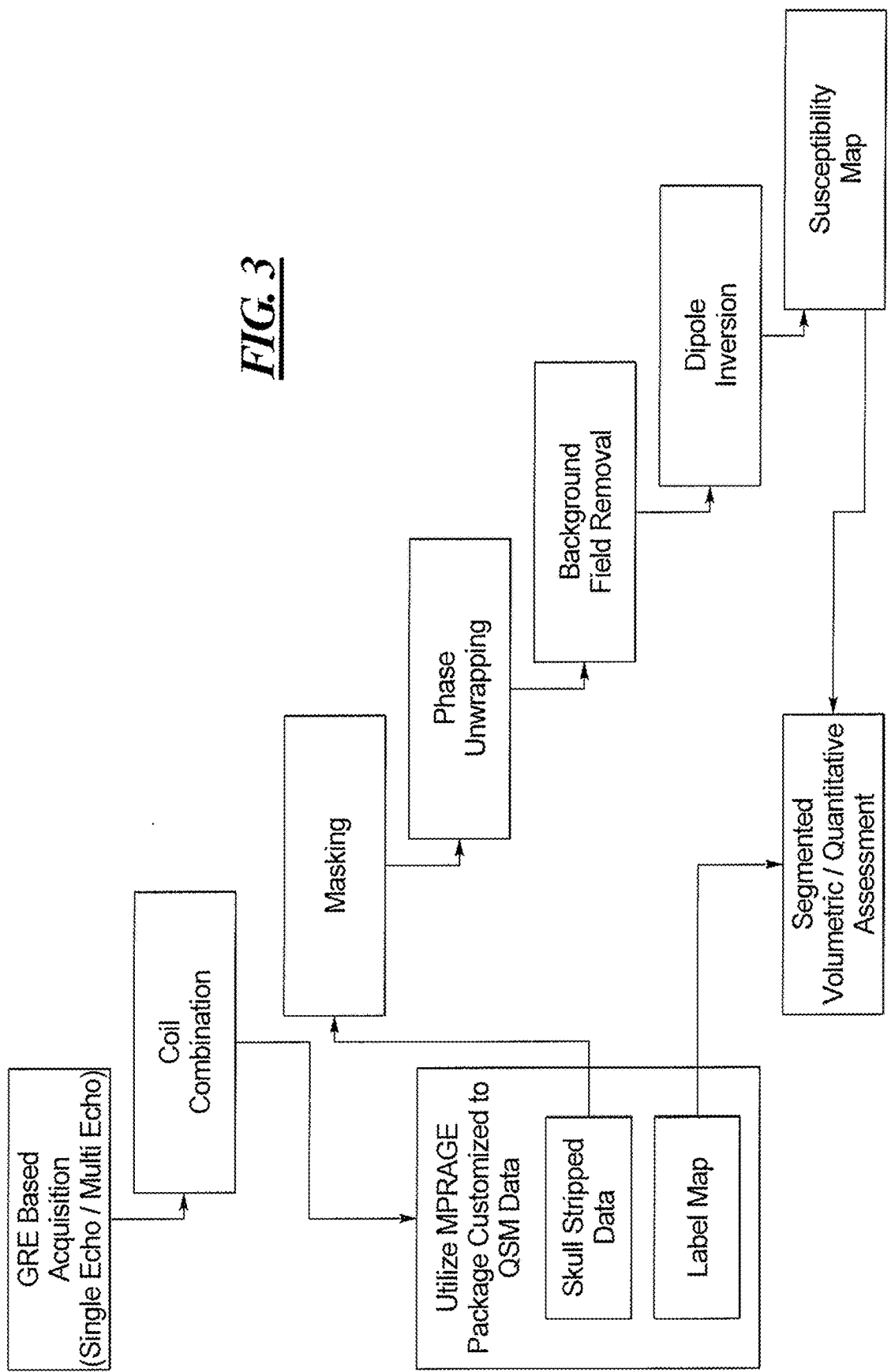
FIG. 3 is a flowchart showing the basic sets of a QSM pipeline in accordance with the present invention.

As shown in FIG. 3, in accordance with the invention, a morphometry package of the type that was originally designed for MPRAGE, for example, but now customized to QSM data, is used in order to produce skull stripped data and a label map. The skull stripped data are provided as an input to the masking algorithm, and the label map is subjected to segmented volumetric/quantitative assessment, together with the susceptibility map.

In accordance with the invention, the magnitude image is fed to a volumetric morphometric package that is conventionally applied to T1w MPRAGE images. The customization of this pipeline in accordance with the invention requires the creation of QSM magnitude atlas template in registration with the incoming data, in order to provide the skull stripped data to the masking step.

Two embodiments are disclosed below for creating the optimized GRE/QSM atlas. The primary parameter that influences signal and contrast in a GRE acquisition, such as signal loss in a T2*w image, occurs around the sinuses and ears, and is subject-dependent. In view of the fact that image acquisition occurs at a specified TE (echo time), in accordance with the invention a representative atlas is created from the scanning of normal volunteers from images acquired for a specific TE, as shown in FIG. 4. Different atlases can be respectively created for images acquired at different echo times, so that each atlas is echo time-specific, thereby enabling a range of echo times to be represented by the multiple atlases.

As noted above, signal loss in a T2*w acquisition is dependent on the echo time during which the MR data are acquired. The manner of generating an atlas as illustrated in FIG. 4 would not be appropriate if the TE of the acquired image were significantly different from the TE used to build the atlas.

FIG. 5 therefore illustrates another embodiment for building the atlas, again customized to the TE of the incoming image, but in FIG. 5, multi-echo data from normal subjects are used, and intermediate atlases are then generated for each echo time. The atlas that is used as an input into the volumetric morphometric pipeline can then be selected from, or be a combination based on weighted averages of, these intermediate atlases.

As shown in FIG. 5, exemplary echo times of 6.8 ms 13.6 ms, and 20.4 ms are selected for each of the subjects 1 through N. As noted in FIG. 5, M echoes are used, so that in the example of FIG. 5, M=3.

For Subject 1 shown in FIG. 5, the circled area schematically illustrates signal loss due to air-tissue susceptibility interfaces, wherein the signal loss becomes progressively larger in successive echo times. The images from N subjects and M echoes are combined, as schematically illustrated at the right in FIG. 5, so as to produce a normalized reputation of the all of the subjects for each echo. The echo time from which data for a current scan are acquired (17 ms in the example of FIG. 5) is then designated in the computer, and a customized QSM atlas is then generated either based on the closest echo to the echo time of the current scan, or a weighted average of the nearest echo times.

A further alternative is to generate a priori information from a subsequent segmentation of the T2*w data, similar to what is done for T1w MPRAGE images. This can then be used as an input to define significant edges to assist in the regularization of the dipole inversion, which means there would also be an output from the label map in FIG. 3 to the dipole inversion step shown in FIG. 3. In addition to providing a priori information for the dipole inversion, this could also create predefined region of interests that could be used for normalization and quantification steps of the final QSM map to be provided as a report for the clinician. This step would also improve the reproducibility of the approach by removing user input.

Figure 1:
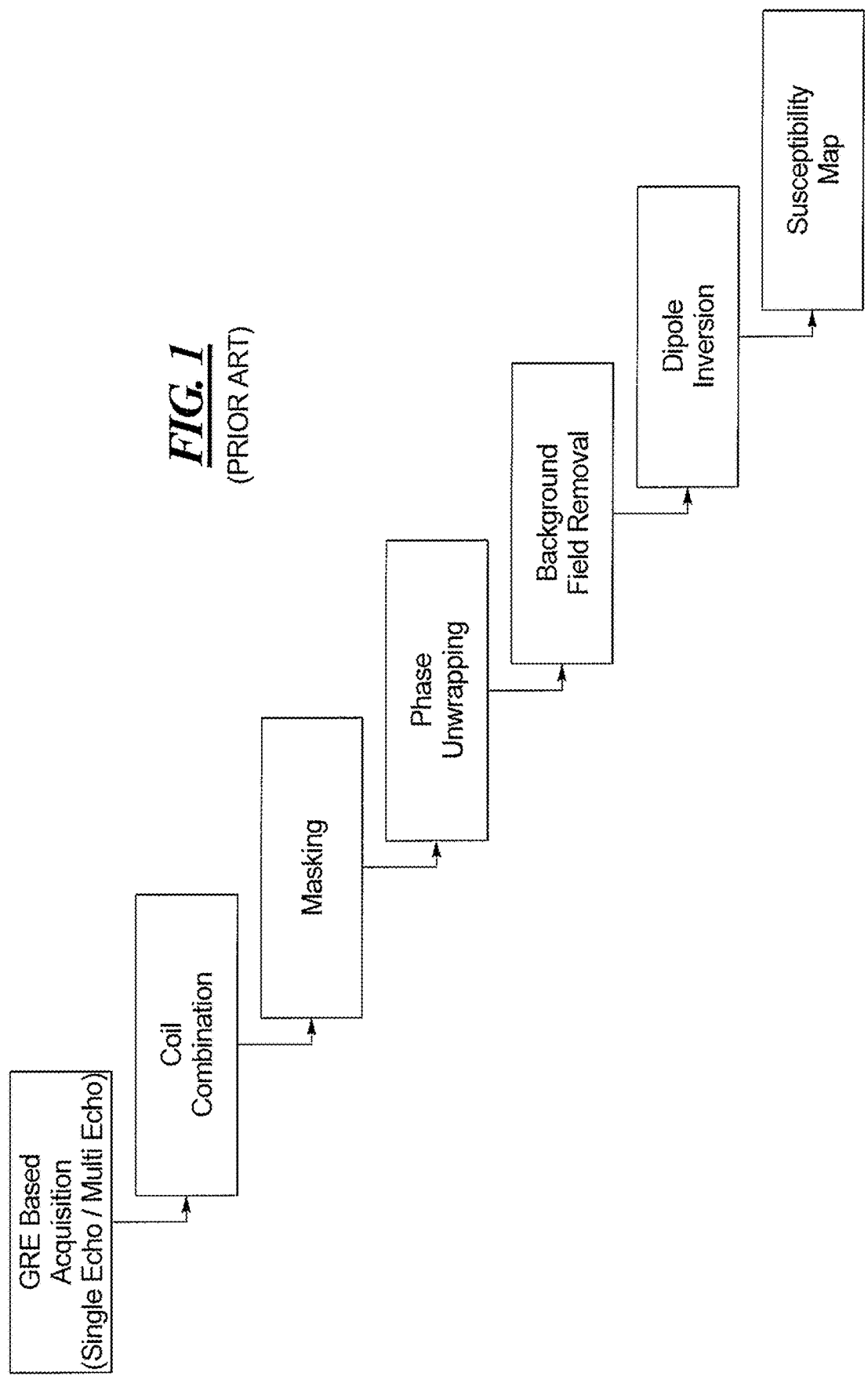
FIG. 1, as noted above, is a flowchart of the basic steps of a conventional QSM pipeline.

The present invention also encompasses a non-transitory, computer-readable data storage medium encoded with programming instructions that, when loaded into the control computer 10 of the magnetic resonance system in accordance with the invention shown in FIG. 1, cause the system to operate in order to implement any or all embodiments of the method according to the invention, as described above.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for quantitative susceptibility mapping (QSM), comprising:
   operating a magnetic resonance (MR) data acquisition scanner in order to execute a gradient echo MR data acquisition sequence, so as to acquire MR data from a current subject during an echo of said gradient echo MR data acquisition sequence using a radio-frequency (RF) reception coil combination of said MR data acquisition scanner;
   providing the acquired MR data to a processor and, in said processor, executing an MR image reconstruction algorithm in order to reconstruct an MR image of the current subject;
   in said processor, executing a QSM mapping algorithm in which said at least one MR image of the current subject is used as an input, said QSM mapping algorithm including a masking step in order to generate a mask that is used in subsequent steps of said QSM mapping algorithm in order to generate a magnetic susceptibility map that represents a spatial distribution of magnetic susceptibility values of tissue in the current subject;
   in said processor, executing said masking step by accessing an atlas comprising a plurality of MR images respectively for a plurality of subjects, wherein each of said MR images in said atlas was generated from a same echo in a gradient echo MR data acquisition sequence as said echo during which said MR data were acquired from said current subject, and combining said MR images from said atlas to produce said mask; and
   in said processor, generating a data file comprising said magnetic susceptibility map and making the data file available from the processor in electronic form.

2. A method as claimed in claim 1 comprising operating said MR data acquisition scanner in order to acquire said MR data from the brain of the current subject and, in said processor, executing said masking step to generate skull stripped data as said mask.

3. A method as claimed in claim 1 comprising:
   in said processor, executing said masking step by accessing, as said atlas, an atlas comprising a plurality of MR image sets respectively for a plurality of subjects, wherein each of said MR image sets comprises respective MR images of a respective subject reconstructed from MR data acquired from the respective subject during a plurality of echoes in a gradient echo MR data acquisition sequence;
   in said processor, executing said masking step by combining the respective MR image for each respective echo in the plurality of MR image data sets in order to form a normative representation of all of said subjects for each echo; and
   in said processor, executing said masking step by combining the respective normative representations of all subjects for each echo dependent on the echo time during which said MR data were acquired from said current subject.

4. A method as claimed in claim 3 comprising combining the respective normative representations of all subjects for each echo dependent on said echo during which said MR data were acquired from said current subject by identifying two echo times among said normative representations that are adjacent to the echo time for said current subject, and forming a weighted average of said two adjacent echo times.

5. A method as claimed in claim 3 comprising combining said normative representations of all subjects for each echo dependent on said echo during which said MR data were acquired from the current subject by identifying a closest echo, among said normative representations, to said echo during which said MR data were acquired from the current examination subject, and using said normative representation of all subjects for said closest echo as said combination.

6. A magnetic resonance (MR) apparatus for quantitative susceptibility mapping (QSM), comprising:
   a MR data acquisition scanner comprising a radio-frequency (RF) reception coil combination;
   a computer configured to operate MR data acquisition scanner in order to execute a gradient echo MR data acquisition sequence, so as to acquire MR data from a current subject during an echo of said gradient echo MR data acquisition sequence using said RF reception coil combination of said MR data acquisition scanner;
   a processor provided with the acquired MR data, said processor being configured to execute an MR image reconstruction algorithm in order to reconstruct an MR image of the current subject;
   said processor being further configured to execute a QSM mapping algorithm in which said at least one MR image of the current subject is used as an input, said QSM mapping algorithm including a masking step in order to generate a mask that is used in subsequent steps of said QSM mapping algorithm in order to generate a magnetic susceptibility map that represents a spatial distribution of magnetic susceptibility values of tissue in the current subject;

said processor being configured to execute said masking step by accessing an atlas comprising a plurality of MR images respectively for a plurality of subjects, wherein each of said MR images in said atlas was generated from a same echo in a gradient echo MR data acquisition sequence as said echo during which said MR data were acquired from said current subject, and combining said MR images from said atlas to produce said mask; and said processor being configured to generate a data file comprising said magnetic susceptibility map and make the data file available from the processor in electronic form.

7. An apparatus as claimed in claim 6 wherein said computer is configured to operate said MR data acquisition scanner in order to acquire said MR data from the brain of the current subject, and said processor is configured to execute said masking step to generate skull stripped data as said mask.

8. An apparatus as claimed in claim 6 wherein:
said processor is configured to execute said masking step by accessing, as said atlas, an atlas comprising a plurality of MR image sets respectively for a plurality of subjects, wherein each of said MR image sets comprises respective MR images of a respective subject reconstructed from MR data acquired from the respective subject during a plurality of echoes in a gradient echo MR data acquisition sequence;

said processor is configured to execute said masking step by combining the respective MR image for each respective echo in the plurality of MR image data sets in order to form a normative representation of all of said subjects for each echo; and said processor is configured to execute said masking step by combining the respective normative representations of all subjects for each echo dependent on the echo time during which said MR data were acquired from said current subject.

9. An apparatus as claimed in claim 8 wherein said processor is configured to combine the respective normative representations of all subjects for each echo dependent on said echo during which said MR data were acquired from said current subject by identifying two echo times among said normative representations that are adjacent to the echo time for said current subject, and forming a weighted average of said two adjacent echo times.

10. An apparatus as claimed in claim 8 said processor is configured to combine said normative representations of all subjects for each echo dependent on said echo during which said MR data were acquired from the current subject by identifying a closest echo, among said normative representations, to said echo during which said MR data were acquired from the current examination subject, and using said normative representation of all subjects for said closest echo as said combination.

11. A non-transitory, computer-readable data storage medium encoded with programming instructions, said storage medium being loaded into a computer of a magnetic resonance (MR) apparatus comprising an MR data acquisition scanner having a radio-frequency (RF) reception coil combination, said programming instructions causing said computer to:

operate said MR data acquisition scanner in order to execute a gradient echo MR data acquisition sequence, so as to acquire MR data from a current subject during an echo of said gradient echo MR data acquisition sequence using said RF reception coil combination of said MR data acquisition scanner;

execute an MR image reconstruction algorithm in order to reconstruct an MR image of the current subject;

execute a QSM mapping algorithm in which said at least one MR image of the current subject is used as an input, said QSM mapping algorithm including a masking step in order to generate a mask that is used in subsequent steps of said QSM mapping algorithm in order to generate a magnetic susceptibility map that represents a spatial distribution of magnetic susceptibility values of tissue in the current subject;

execute said masking step by accessing an atlas comprising a plurality of MR images respectively for a plurality of subjects, wherein each of said MR images in said atlas was generated from a same echo in a gradient echo MR data acquisition sequence as said echo during which said MR data were acquired from said current subject, and combining said MR images from said atlas to produce said mask; and generate a data file comprising said magnetic susceptibility map and make the data file available from the processor in electronic form.

12. A data storage medium as claimed in claim 11 wherein said programming instructions cause said computer to operate said MR data acquisition scanner in order to acquire said MR data from the brain of the current subject, and execute said masking step to generate skull stripped data as said mask.

13. A data storage medium as claimed in claim 11 wherein said programming instructions cause said computer to:
execute said masking step by accessing, as said atlas, an atlas comprising a plurality of MR image sets respectively for a plurality of subjects, wherein each of said MR image sets comprises respective MR images of a respective subject reconstructed from MR data acquired from the respective subject during a plurality of echoes in a gradient echo MR data acquisition sequence;

execute said masking step by combining the respective MR image for each respective echo in the plurality of MR image data sets in order to form a normative representation of all of said subjects for each echo; and execute said masking step by combining the respective normative representations of all subjects for each echo dependent on the echo time during which said MR data were acquired from said current subject.

14. A data storage medium as claimed in claim 13 wherein said programming instructions cause said computer to combine the respective normative representations of all subjects for each echo dependent on said echo during which said MR data were acquired from said current subject by identifying two echo times among said normative representations that are adjacent to the echo time for said current subject, and form a weighted average of said two adjacent echo times.

15. A data storage medium as claimed in claim 13 wherein said programming instructions cause said computer to combine said normative representations of all subjects for each echo dependent on said echo during which said MR data were acquired from the current subject by identifying a closest echo, among said normative representations, to said echo during which said MR data were acquired from the current examination subject, and use said normative representation of all subjects for said closest echo as said combination.

16. A method as claimed in claim 1, wherein the processor is configured to execute the QSM mapping algorithm using, as the input of the at least one MR image of the current subject, a magnitude image.

17. A method as claimed in claim 16, wherein the processor is configured to step use the magnitude image as an input to a volumetric morphometric package that processes T1-weighted magnetization-prepared 180 degrees radio-frequency pulses and rapid gradient-echo (MPRAGE) images.

18. A method as claimed in claim 17, wherein the processor is configured to an generate the atlas as a QSM magnitude atlas template in registration with incoming data.

* * * * *